(12) United States Patent
Yoon

(10) Patent No.: US 6,906,656 B2
(45) Date of Patent: Jun. 14, 2005

(54) FLASH TYPE ANALOG TO DIGITAL CONVERTING METHOD AND CIRCUIT

(75) Inventor: Jae-Chul Yoon, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/688,286

(22) Filed: Oct. 17, 2003

(65) Prior Publication Data

US 2004/0085236 A1 May 6, 2004

(30) Foreign Application Priority Data

Oct. 22, 2002 (KR) ................................ 10-2002-0064659

(51) Int. Cl.$^7$ ................................................ H03M 1/36
(52) U.S. Cl. ...................................... 341/158; 341/159
(58) Field of Search ................................ 341/158, 159, 341/160

(56) References Cited

U.S. PATENT DOCUMENTS

| | | | | |
|---|---|---|---|---|
| 3,721,975 | A | * | 3/1973 | Brinkman et al. .......... 341/156 |
| 4,774,498 | A | * | 9/1988 | Traa ........................... 341/159 |
| 5,329,279 | A | * | 7/1994 | Barbu et al. .................. 341/50 |
| 5,889,487 | A | * | 3/1999 | Burns et al. ................ 341/159 |
| 6,433,725 | B1 | * | 8/2002 | Chen et al. ................. 341/155 |
| 6,452,529 | B1 | | 9/2002 | Li |
| 2002/0044077 | A1 | * | 4/2002 | Tsukamoto ................. 341/160 |

OTHER PUBLICATIONS

Pereira, P. et al; Wallace tree encoding in folding and interpolation ADCs; IEEE International Symposium on Circuits and Systems, 2002. ISCAS 2002., vol.: 1, May 26–29, 2002 pp.: I–509–I–512 vol. 1.*

Kaess, F. et al.; New encoding scheme for high–speed flash ADC's; Proceedings of 1997 IEEE International Symposium on Circuits and Systems, 1997. ISCAS '97., , vol.: 1, Jun. 9–12, 1997 pp.: 5–8.*

Silva, R.T.; A low–power CMOS folding and interpolation A/D converter with error correction; Proceedings of the 2003 International Symposium on Circuits and Systems, 2003. ISCAS '03., vol.: 1, pp. 949–952, May 25–28, 2003.*

* cited by examiner

*Primary Examiner*—Howard L. Williams
(74) *Attorney, Agent, or Firm*—F.Chau & Associates, LLC

(57) ABSTRACT

The present invention discloses a flash type analog to digital converting method, comprising: (a) receiving an analog signal and generating 128-bit digital thermometer code based on the analog signal; (b) $3_{rd}$-compressing the 128-bit thermometer code to generate a 16-bit thermometer code and a 3-bit carry; and (c) encoding the 128-bit thermometer code to generate a 7-bit digital signal. Therefore, a layout area can be reduced because, after a $2^n$-bit thermometer code is compressed, the compressed digital signal is encoded to generate an n-bit digital signal.

10 Claims, 8 Drawing Sheets

FLASH TYPE ANALOG TO DIGITAL CONVERTING METHOD AND CIRCUIT

BACKGROUND OF THE INVENTION

1. Field of the Invention

The present invention relates to an analog to digital converting circuit, and more particularly, to a flash type analog to digital converting method and circuit.

2. Description of the Related Art

A conventional flash type analog to digital (A/D) converting circuit includes a pre-amplifier, a thermometer code generating circuit, and an encoder. The pre-amplifier and the thermometer code generating circuit receive an analog signal and generate a digital signal having a $2^n$-bit thermometer code. The encoder then directly converts the digital signal having the generated thermometer code into an n-bit digital signal. A thermometer code refers to a digital signal in which a bit string of "0"s and a bit string of "1"s are arranged to face each other, such as "000 ... 000111 ... 111".

However, the conventional flash type A/D converting circuit has a disadvantage in that, since the encoder directly converts the digital signal having a $2^n$-bit of thermometer code into an n-bit of digital signal, a layout area of the encoder must be increased as the number of bits of the digital thermometer code is increased.

FIG. 1 is a block diagram of a conventional flash type A/D converting circuit. As shown in FIG. 1, the conventional flash type A/D converting circuit includes a pre-amplifier 10, a thermometer code generating circuit 12, and an encoder 14.

The pre-amplifier 10 amplifies an input analog signal Ain to generate K-number of analog signals Ain. The thermometer code generating circuit 12 receives the k-number of analog signals Ain to generate a digital signal having a $2^n$-bit thermometer code. The encoder 14 encodes the digital signal having a $2^n$-bit thermometer code to generate an n-bit digital signal Dout. The conventional flash type A/D converting circuit of FIG. 1 is configured such that the encoder 14 directly encodes the digital signal having a $2^n$-bit thermometer code to generate an n-bit digital signal Dout.

As a result, the layout area of the conventional flash type A/D converting circuit must be increased when the number of bits of the $2^n$-bit thermometer code generated from the thermometer code generating circuit 12 is large.

For example, when converting a 128-bit thermometer code into a 7-bit digital signal, the layout area of the converting circuit must be four times the layout area of a converting circuit used to convert a 32-bit thermometer code into a 5-bit digital signal.

That is, the layout area of the encoder 14 does not matter when the number of bits of the $2^n$-bit thermometer code is small. However, the layout area size of the encoder 14 does matter when the number of bits of the $2^n$-bit thermometer code is large.

SUMMARY OF THE INVENTION

One aspect of the present invention is to provide a flash type analog to digital (A/D) converting method and circuit which does not require an increase in the layout area of the encoder even when the number of bits of the thermometer code is large.

The exemplary embodiments of the present invention provide a flash type analog to digital converting method, comprising: (a) receiving an analog signal and generating a $2^n$-bit digital thermometer code based on the analog signal; (b) compressing the $2^n$-bit digital thermometer code to generate a compressed thermometer code; and (c) encoding the compressed thermometer code to generate an n-bit digital signal.

In the step (b) the $2^n$-bit digital thermometer code is compressed j times to generate a $(2^{n-j}+j)$-bit thermometer code, where $j \geq 1$.

Another embodiment of the present invention further provides a flash type analog to digital converting method, comprising: (a) receiving an analog signal and generating a 128-bit digital thermometer code based on the analog signal; (b) $3_{rd}$-compressing the 128-bit thermometer code to generate a 16-bit thermometer code and a 3-bit carry; and (c) encoding the 128-bit thermometer code to generate a 7-bit digital signal.

The step (b) includes a $1_{st}$-compression step of generating 64-bit thermometer code by folding the 128-bit thermometer code and XORing the corresponding bits with one another, and generating a $65_{th}$ bit of the 128-bit thermometer code as a first carry; a $2_{nd}$-compression step of generating 32-bit thermometer code by folding the 64-bit thermometer code and XORing the corresponding bits with one another, and generating a $33_{rd}$ bit of the 64-bit thermometer code as a second carry; and a $3_{rd}$-compression step of generating a 16-bit thermometer code by folding the 32-bit thermometer code and XORing the corresponding bits with one another, and generating a $17_{th}$ bit of the 32-bit thermometer code as a third carry.

Another embodiment of the present invention further provides a flash type analog to digital converting circuit, comprising: a thermometer code generating means for receiving an analog signal and generating a $2^n$-bit digital thermometer code based on the analog signal; a thermometer code compression means for compressing the $2^n$-bit thermometer code to generate a digital signal having a compressed thermometer code; and an encoding means for encoding the compressed thermometer code to generate an n-bit digital signal.

Another embodiment of the present invention further provides a flash type analog to digital converting circuit, comprising: a thermometer code generating means for receiving an analog signal and generating a 128-bit digital thermometer code based on the analog signal; a thermometer code compression means for $3_{rd}$-compressing the 128-bit of thermometer code to generate a 16-bit thermometer code and a 3-bit carry; and an encoding means for encoding the 128-bit thermometer code to generate a 7-bit digital signal.

Another embodiment of the present invention further provides a flash type analog to digital converting circuit, comprising a thermometer code generating circuit that receives an analog signal and generates a $2^n$-bit thermometer code based on the analog signal, a thermometer code compression circuit that compresses the $2^n$-bit thermometer code to generate a compressed thermometer code, and an encoder that encodes the compressed thermometer code to generate an n-bit digital signal.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to preferred embodiments of the present invention, examples of which are illustrated in the accompanying drawings.

Figure 2:
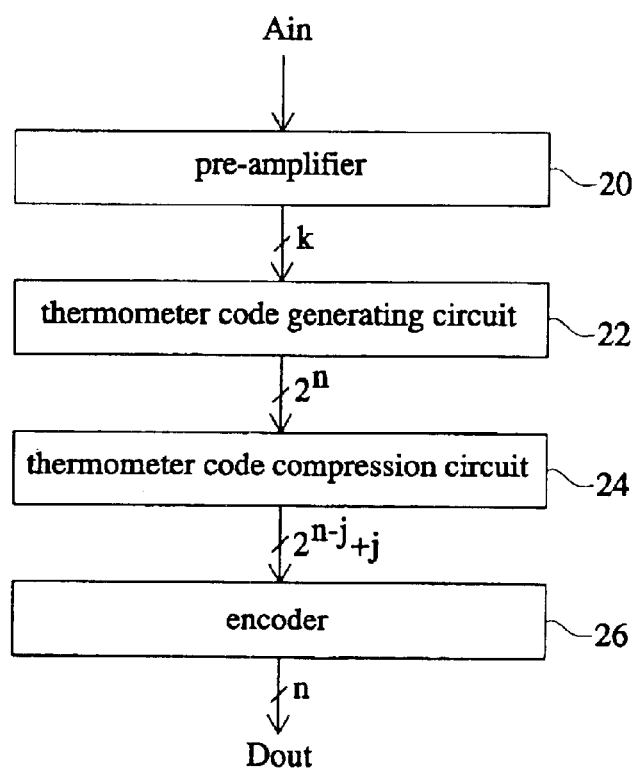
FIG. 2 is a flow diagram illustrating signal flow of a flash type analog to digital (A/D) converting circuit according to an embodiment of the present invention.

FIG. 2 is a flow diagram illustrating signal flow of a flash type analog to digital (A/D) converting circuit according to one exemplary embodiment of the present invention. The flash type A/D converting circuit of FIG. 2 includes a pre-amplifier 20, a thermometer code generating circuit 22, a thermometer code compression circuit 24, and an encoder 26.

Operation of the flash type A/D converting circuit of FIG. 2 will be explained below.

The pre-amplifier 20 amplifies an input analog signal Ain to generate a k-number of analog signals Ain. The thermometer code generating circuit 22 receives the k-number of analog signals Ain and generates a $2^n$-bit digital thermometer code. The thermometer code compression circuit 24 compresses the $2^n$-bit thermometer code j times to generate a $(2^{n-j}+j)$-bit digital signal, where $j \geq 1$. The encoder 26 encodes the $(2^{n-j}+j)$-bit digital signal to generate an n-bit digital signal Dout.

That is, the flash type A/D converting circuit of FIG. 2 compresses the $2^n$-bit thermometer code generated from the thermometer code generating circuit 22 to generate a $(2^{n-j}+j)$-bit digital signal before the encoder 26 encodes it to generate an n-bit digital signal Dout.

Figure 1:
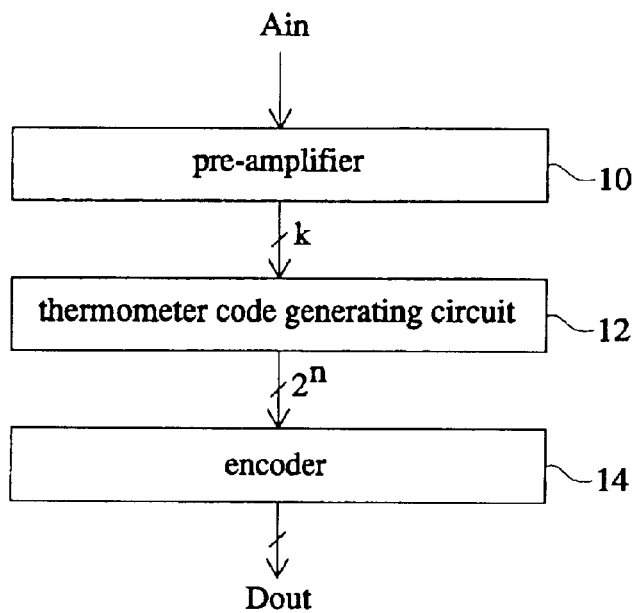
FIG. 1 is a flow diagram illustrating signal flow of a conventional flash type A/D converting circuit.

As a result, the layout area size is significantly reduced. That is, the flash type A/D converting circuit of FIG. 2 is much smaller than that of FIG. 1, i.e., when the encoder generates the n-bit digital signal by directly encoding the $2^n$-bit thermometer code.

Figure 3:
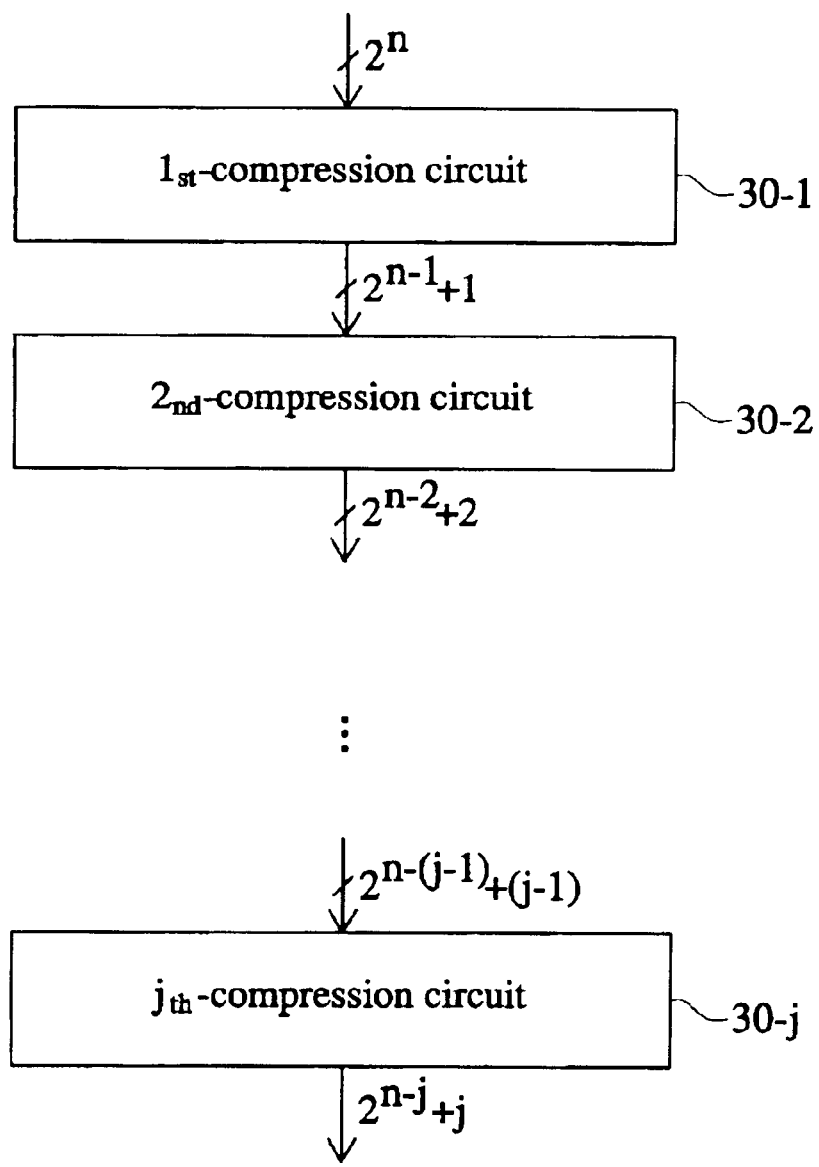
FIG. 3 is a signal flow diagram of a thermometer code compression circuit.

FIG. 3 is a flow diagram illustrating signal flow of the thermometer code compression circuit. The thermometer code compression circuit of FIG. 3 includes first to $j_{th}$ compression circuits 30-1 to 30-j.

Operation of the components of the thermometer code compression circuit of FIG. 3 will be explained below.

The first compression circuit 30-1 compresses a $2^n$-bit digital signal to generate a $(2^{n-1}+1)$-bit digital signal. The second compression circuit 30-2 compresses a $(2^{n-1}+1)$-bit digital signal to generate a $(2^{n-2}+2)$-bit digital signal. In the same way, the $j_{th}$ compression circuit 30-j compresses a $(2^{n-(j-1)}+(j-1))$-bit digital signal to generate a $(2^{n-j}+j)$-bit digital signal.

FIGS. 4 to 7 show a thermometer code compression method of the flash type A/D converting circuit according to an embodiment of the present invention, wherein a horizontal axis denotes $2^n$ thermometer codes, and a vertical axis denotes a $2^n$-bit digital thermometer codes B1 to B$2^n$ generated from the thermometer code generating circuit.

Figure 4:
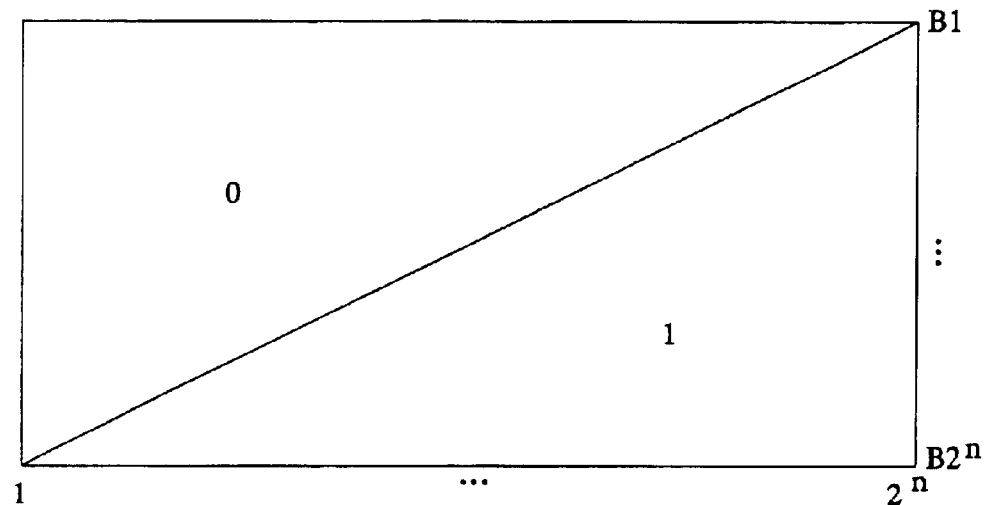
FIGS. 4 to 7 show a thermometer code compression method of the flash type A/D converting circuit according to an embodiment of the present invention.

In FIG. 4, "0" represents a portion in which respective bits of the digital signal are "0", whereas "1" represents a portion in which respective bits of the digital signal are "1".

Figure 5:
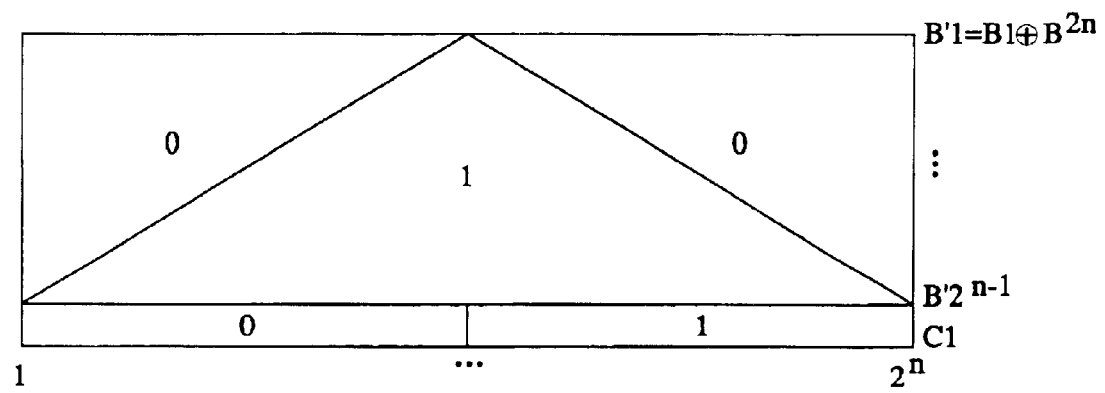

The $2^n$ thermometer codes of FIG. 4 become as shown in FIG. 5 by compressing through the $1_{st}$ compression circuit 30-1 of FIG. 3. A first bit of digital signal B'1 that is $1_{st}$-compressed is generated by XORing a first bit of digital signal B1 and a $2^n$ bit of digital signal B$2^n$. Even though not shown, a second bit of digital signal B'2 which is $1_{st}$-compressed is generated by XORing a second bit of digital signal B2 and a $(2^n-1)_{th}$-bit of digital signal (B$2^n$-1). "XOR" refers to a logic operation in which a digital signal "0" is generated when two input digital signals are the same while a digital signal "1" is generated when two input digital signals are different. By the method described above, a $2^{n-1}{}_{th}$ bit of digital signal B'$2^{n-1}$ which is $1_{st}$-compressed is generated by XORing a $2^{n-1}{}_{th}$ bit of digital signal B$2^{n-1}$ and a $(2^{n-1}+1)_{th}$-bit of digital signal (B$2^{n-1}$+1). The $(2^{n-1}+1)_{th}$-bit of digital signal (B$2^{n-1}$+1) is generated as a carry C1. Therefore, the first compression circuit 30-1 compresses $2^n$-bit digital signals B1 to B$2^n$ to generate $(2^{n-1}+1)$-bit digital signals B'1 to B'$2^{n-1}$ and C1. This can be regulated by the following expressions:

$$B'1 = B1 \oplus B2^n,$$

$$B'2 = B2 \oplus B2^n-1,$$

$$\ldots$$

$$B'2^{n-1} = B2^{n-1} \oplus B2^{n-1}+1, \text{ and}$$

$$C1 = B2^{n-1}+1.$$

As can be seen in FIG. 5, the digital signals B'1 to B'$2^{n-1}$ which are compressed by the first compression circuit also represent the digital hermometer code.

Figure 6:
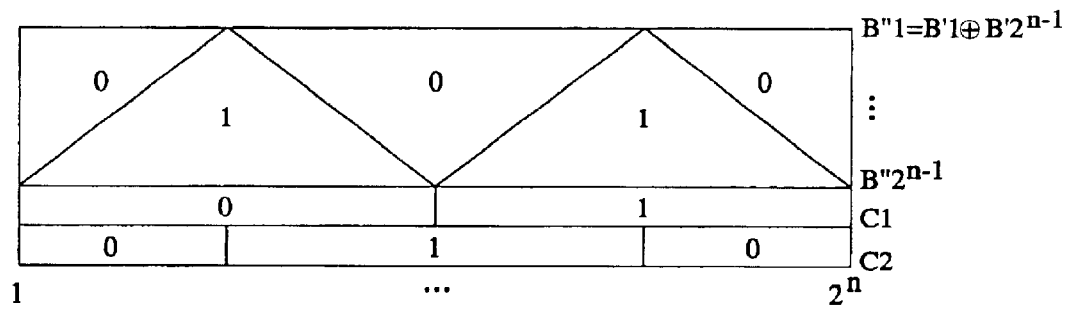

The digital signals B'1 to B'$2^{n-1}$ having a $2^{n-1}$-number of thermometer codes of FIG. 5 become as shown in FIG. 6 by compressing through the second compression circuit 30-2 of FIG. 3. A first bit of digital signal B"1 which is $2_{nd}$-compressed is generated by XORing the first bit of digital signal B'1 which is $1_{st}$-compressed and the $2^{n-1}{}_{th}$ bit of digital signal B'$2^{n-1}$. Even though not shown, a second bit of digital signal B"2 which is $2_{nd}$-compressed is generated by XORing a first bit of digital signal B'2 which are $1_{st}$-compressed and a $(2^{n-1}-1)_{th}$-bit of digital signal (B'$2^{n-1}$-1) which is $1_{st}$-compressed. By the method described above, a $2^{n-2}{}_{th}$ bit of digital signal B"$2^{n-2}$ which is $2_{nd}$-compressed is generated by XORing a $2^{n-2}{}_{th}$ bit of digital signal B'$2^{n-2}$ which is $1_{st}$-compressed and a $(2^{n-2}+1)_{th}$-bit of digital signal (B'$2^{n-2}$+1) which is $1_{st}$-compressed. The $(2^{n-1}+1)_{th}$-bit of digital signal (B$2^{n-1}$+1) is generated as a carry C1, and the $(2^{n-2}+1)_{th}$-bit of digital signal (B'$2^{n-2}$+1) which is $1_{st}$-compressed is generated as a carry C2. Therefore, the second compression circuit 30-2 compresses $2^{n-l}$-bit digital signals B'1 to B'$2^{n-1}$ to generate $(2^{n-2}+2)$-bit digital signals B"1 to B"$2^{n-2}$, C1, and C2. This can be regulated by the following expressions:

$$B"1 = B'1 \oplus B'2^{n-1},$$

$$B"2 = B2 \oplus B2^{n-1}-1,$$

$$B''2^{n-2}=B2^{n-2}\oplus B2^{n-2}+1,$$

$$C1=B2^{n-1}+1, \text{ and}$$

$$C2=B'2^{n-2}+1.$$

As can be seen in FIG. 6, the digital signals B"1 to B"$2^{n-2}$ which are compressed by the second compression circuit also represent the digital thermometer code.

Figure 7:
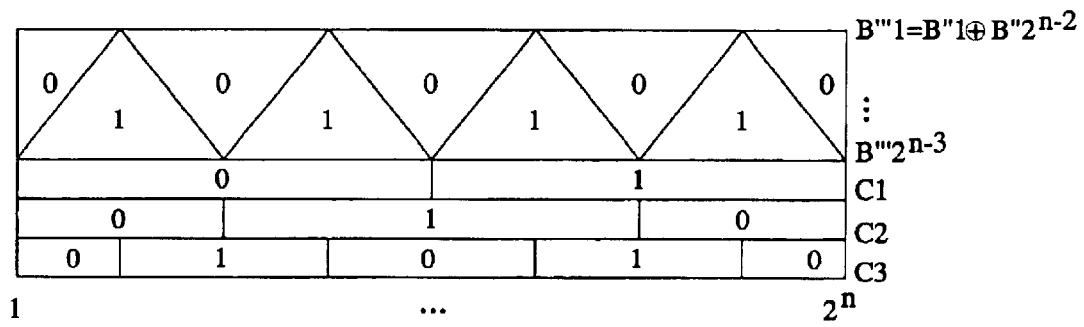

The digital signals B"1 to B"$2^{n-2}$ having a $2^{n-2}$-number of thermometer codes of FIG. 6 become as shown in FIG. 7 by compressing through the third compression circuit. A first bit of digital signal B'''1 which is $3_{rd}$-compressed is generated by XORing the first bit of digital signal B"1 which is $2_{nd}$-compressed and the $2^{n-2}{}_{th}$-bit of digital signal B"$2^{n-2}$. Even though not shown, a second bit of digital signal B'''2 which is $3_{rd}$-compressed is generated by XORing a second bit of digital signal B"2 which is $2_{nd}$-compressed and a $(2^{n-2}-1)_{th}$-bit of digital signal (B"$2^{n-2}-1$) which is $2_{nd}$-compressed. By the method described above, a $2^{n-3}{}_{th}$ bit of digital signal B'''$2^{n-3}$ which is $3_{rd}$-compressed is generated by XORing a $2^{n-3}{}_{th}$ bit of digital signal B"$2^{n-3}$ which is $2_{nd}$-compressed and a $(2^{n-3}+1)_{th}$-bit of digital signal (B"$2^{n-3}$+1) which is $2_{nd}$-compressed. The digital signal (B$2^{n-1}$+1) is generated as a carry C1, the digital signal (B'$2^{n-2}$+1) is generated as a carry C2, and the digital signal (B"$2^{n-3}$+1) is generated as a carry C3. Therefore, the third compression circuit 30-3 compresses $2^{n-2}$-bit digital signals B'1 to B'$2^{n-2}$ to generate ($2^{n-3}$+3)-bit digital signals B'''1 to B'''$2^{n-3}$, C1, C2, and C3.

The flash type A/D converting method of the present invention folds the $2^n$-bit thermometer code in half and XORs the corresponding bits with one another, where $2^{n-1}$-bit digital signals are generated and a $(2^{n-1}+1)_{th}$-bit of the digital signal is generated as a carry. In the same way, a $2^n$-bit thermometer code is $j_{th}$-compressed before the compressed digital signal is encoded to generate an n-bit digital signal.

For example, when a 128-bit thermometer code is $1_{st}$-compressed, digital signals B'1 to B'64 having a 64-bit thermometer code and a 1-bit carry C1 are generated. Through a $2_{nd}$-compression, digital signals B"1 to B"32 having a 32 bit thermometer code and a 2-bit carry C1 and C2 are generated. Through a $3_{rd}$-compression, digital signals B'''1 to B'''16 having a 16-bit thermometer code and a 3-bit carry C1 to C3 are generated.

That is, the flash type A/D converting circuit of the present invention generates a digital signal having a 16-bit thermometer code and a 3-bit carry by $1_{st}$-, $2_{nd}$, and $3_{rd}$-compressing a digital signal having a 128-bit thermometer, and thereafter an encoding is performed.

Figure 8:
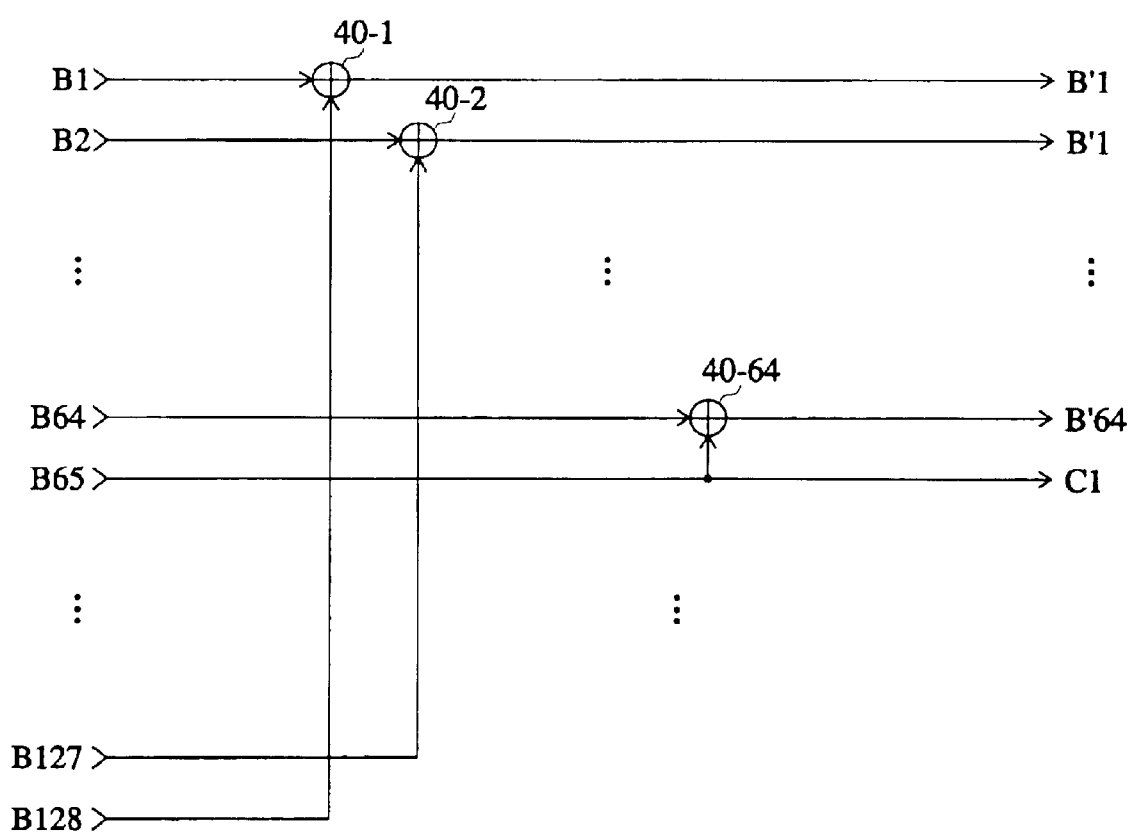
FIG. 8 shows a configuration of a first compression circuit of the flash type A/D converting circuit according an embodiment of the present invention.

FIG. 8 shows a configuration of the first compression circuit of the flash type A/D converting circuit according to an embodiment of the present invention. The first compression circuit of FIG. 8 compresses 128-bit thermometer codes B1 to B128 to generate 64-bit digital signals B'1 to B'64 and a carry C1.

The first compression circuit of FIG. 8 includes 64 XOR gates 40-1 to 40-64. Operation of the first compression circuit will be explained below.

The XOR gate 40-1 XORs the digital signal B1 and the digital signal B128 to generate the digital signal B'1. The XOR gate 40-2 XORs the digital signal B2 and the digital signal B127 to generate the digital signal B'2. The XOR gate 40-64 XORs the digital signal B64 and the digital signal B65 to generate the digital signal B'64. The digital signal B65 is generated as the carry C1.

Figure 9:
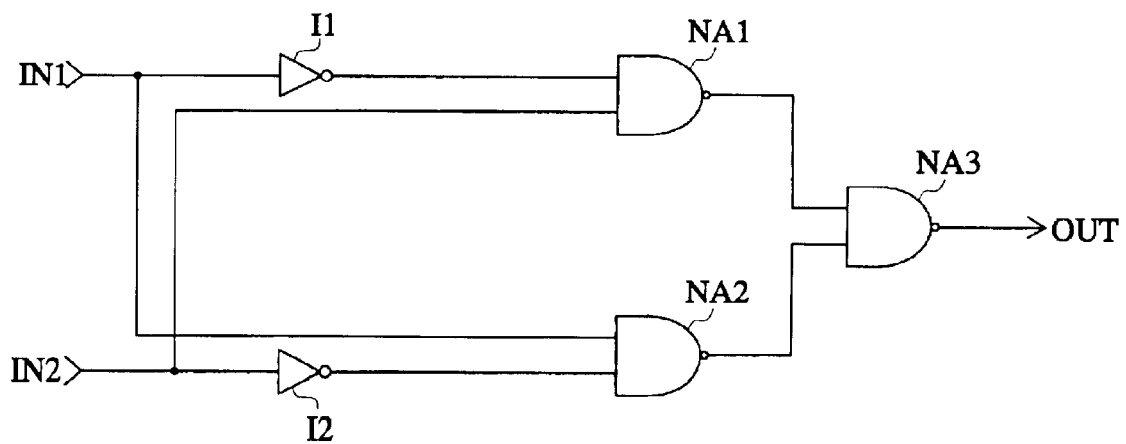
FIG. 9 shows an XOR gate.

FIG. 9 shows a configuration of the XOR gate. The XOR gate includes inverters I1 and I2 and NAND gates NA1 to NA3.

The inverter I1 inverts an input signal IN1. The inverter I2 inverts an input signal IN2. The NAND gate NA1 NANDs an output signal of the inverter I1 and an input signal IN2. The NAND gate NA2 NANDs an output signal of the inverter I2 and an input signal IN1. The NAND gate NA3 NANDs output signals of the NAND gates NA1 and NA2 to generate an output signal.

Operation of the XOR gate is as follows. When the input signals IN1 and IN2 are all "1", the inverters I1 and I2 output a digital signal "0". The NAND gates NA1 and NA2 output a digital signal "1". The NAND gate NA3 outputs "0" as a digital signal OUT.

When the input signals IN1 and IN2 are all "1", "0" is outputted as the digital signal OUT.

When the input signals IN1 and IN2 are "0" and "1" respectively, the inverters I1 and I2 output digital signals "1" and "0" respectively. The NAND gate NA1 outputs a digital signal "0", and the NAND gate NA2 outputs a digital signal "1". The NAND gate NA3 output "1" as a digital signal OUT.

When the input signals IN1 and IN2 are "1" and "0" respectively, "1" is outputted as the digital signal OUT.

By the method described above, the XOR gate of FIG. 9 outputs "0" as a digital signal OUT when the input signal IN1 and IN2 are same, and the XOR gate outputs "1" as a digital signal OUT when the input signals IN1 and IN2 are different. That is, the XOR gate XORs the input signals IN1 and IN2.

Figure 10:
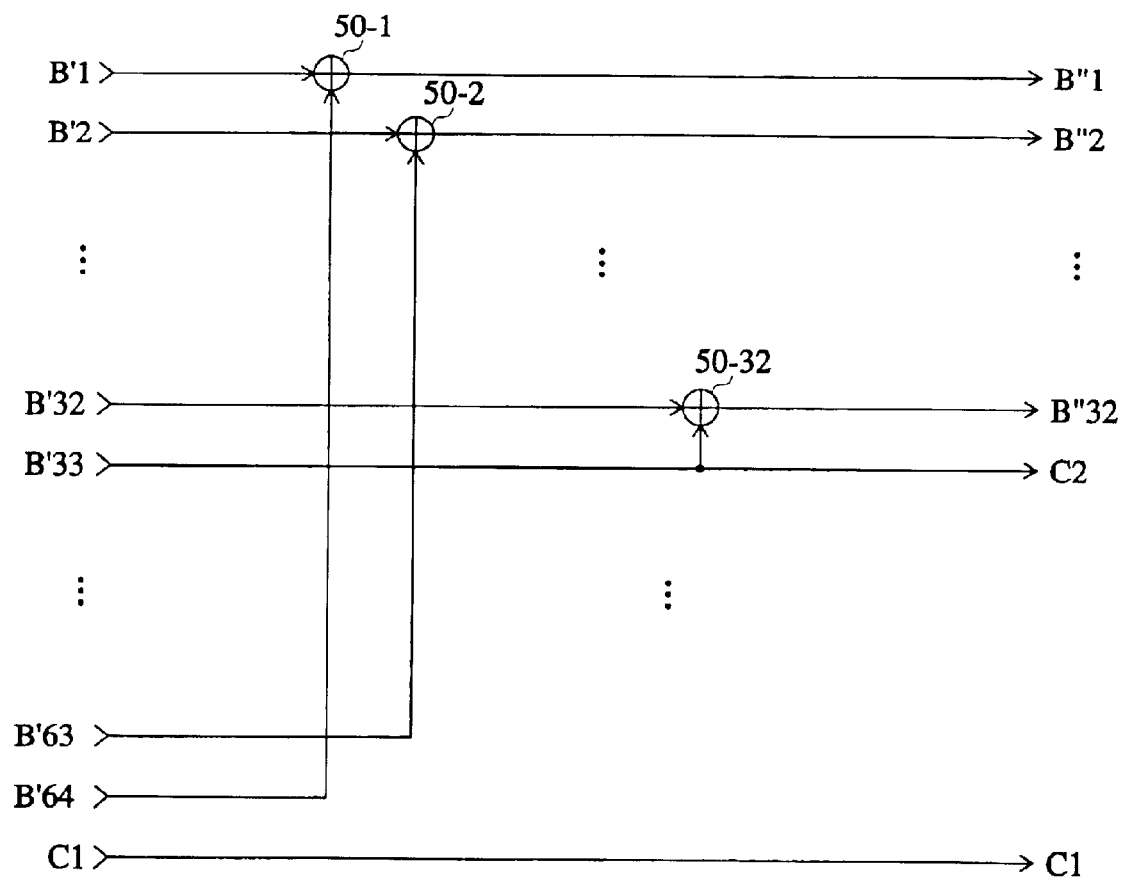
FIG. 10 shows a configuration of a second compression circuit of the flash type A/D converting circuit according to an embodiment of the present invention.

FIG. 10 shows a configuration of the second compression circuit of the flash type A/D converting circuit according to an embodiment of the present invention. The second compression circuit of FIG. 10 compresses digital signals B'1 to B'64 having a 64-bit thermometer code to generate digital signals B"1 to B"32 having a 32-bit thermometer code and 2-bit carries C1 and C2.

The second compression circuit of FIG. 10 includes 32 XOR gates 50-1 to 50-32. Operation of the second compression circuit will be explained below.

The XOR gate 50-1 XORs the digital signal B'1 and the digital signal B'64 to generate the digital signal B"1. The XOR gate 50-2 XORs the digital signal B'2 and the digital signal B'63 to generate the digital signal B"2. The XOR gate 50-32 XORs the digital signal B'32 and the digital signal B'33 to generate the digital signal B"32. The carry C1 output from the first compression circuit is generated, and the digital signal B'33 is generated as the carry C2.

Figure 11:
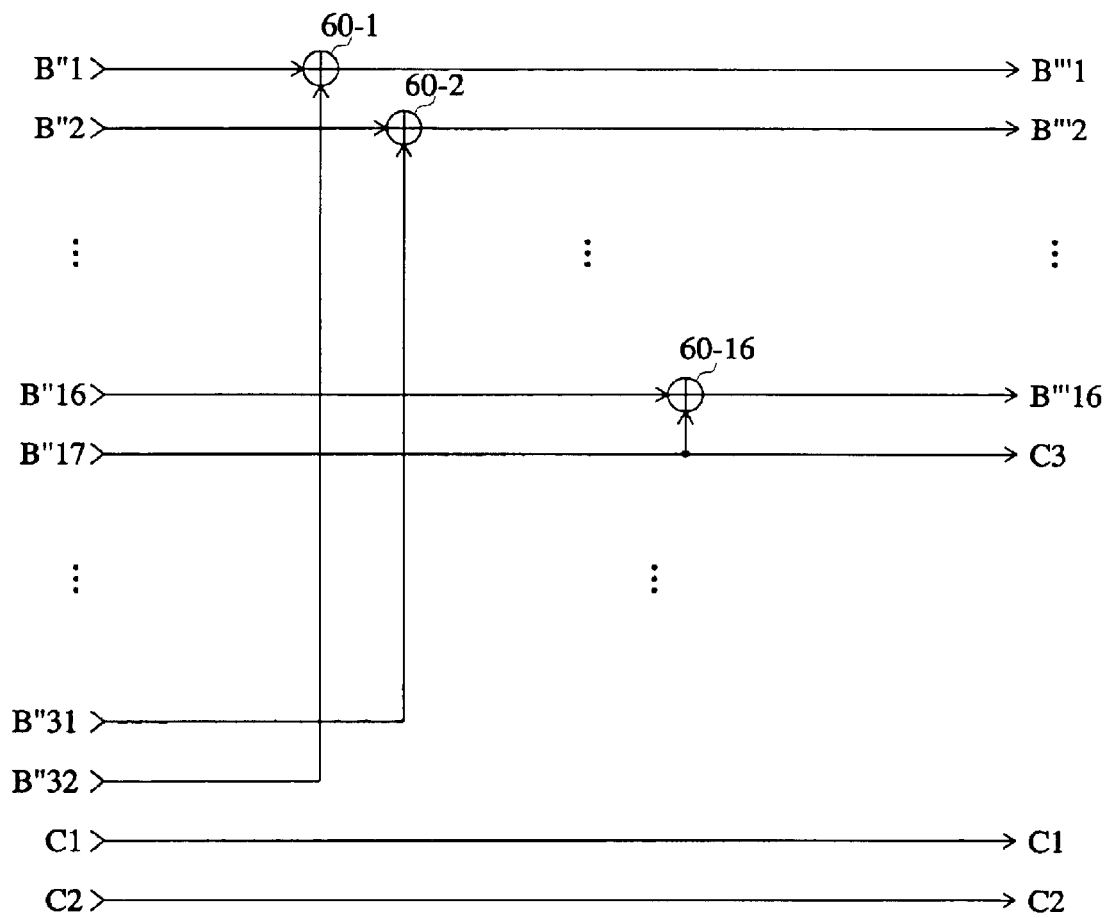
FIG. 11 shows a configuration of a third compression circuit of the flash type A/D converting circuit according to an embodiment of the present invention.

FIG. 11 shows a configuration of the third compression circuit of the flash type A/D converting circuit according to an embodiment of the present invention. The third compression circuit of FIG. 11 compresses digital signals B"1 to B"32 having a 32-bit thermometer code to generate digital signals B'''1 to B'''16 having a 16-bit thermometer code and 3-bit carries C1, C2 and C3.

The third compression circuit of FIG. 11 includes 16 XOR gates 60-1 to 60-16. Operation of the third compression circuit will be explained below.

The XOR gate 60-1 XORs the digital signal B"1 and the digital signal B"32 to generate the digital signal B'''1. The XOR gate 60-2 XORs the digital signal B"2 and the digital signal B"31 to generate the digital signal B'''2. The XOR gate 60-16 XORs the digital signal B"16 and the digital signal B"17 to generate the digital signal B'''16. The carries C1 and C2 output from the second compression circuit are generated, and the digital signal B"17 is generated as the carry C3.

The flash type A/D converting circuit according to an exemplary embodiment of the present invention jth-compresses a 128-bit digital signal to generate a $(2^{n-j}+j)$-bit digital signal and thereafter encodes the $(2^{n-j}+j)$-bit digital signal to generate an n-bit digital signal.

Therefore, the layout area size can be reduced compared to when the $2^n$-bit digital signal is directly encoded to generate an n-bit digital signal. This is because the $(2^{n-j}+j)$-bit digital signal is encoded to generate an n-bit digital signal after a 128-bit digital signal is $j_{th}$-compressed.

In the embodiment described above, a $(2^n+1)_{th}$-bit digital signal is generated as a carry by folding a $2^n$-bit of digital signal. However, the carry can be generated by various methods.

Even though a configuration of an encoder which generates an n-bit digital signal by encoding the $(2^{n-j}+j)$-bit digital signal is not shown, such a configuration can be accomplished by various methods.

Accordingly, the flash type A/D converting method and circuit according to the various exemplary embodiments of the present invention provides a reduced layout area because after a digital signal having a $2^n$-bit thermometer is compressed, the compressed digital signal is encoded to generate an n-bit digital signal.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A flash type analog to digital converting method, comprising:
   (a) receiving an analog signal and generating a $2^n$-bit digital thermometer code based on the analog signal;
   (b) compressing the $2^n$-bit thermometer code to generate a digital signal having a compressed thermometer code, wherein the $2^n$-bit thermometer code is compressed j times to generate a $(2^{n-j}+j)$-bit thermometer code, where $j \geq 1$; and
   (c) encoding the compressed thermometer code to generate an n-bit digital signal.

2. The method of claim 1, wherein in the step (b) the $2^n$-bit thermometer code is compressed to a $2^{n-j}$-bit digital signal by folding the $2^n$-bit thermometer code j times and XORing corresponding bits of the thermometer code with one other, and j-number of carries are generated by generating a $(2^{n-j-1}+1)_{th}$-bit digital signal having the $2^n$-bit thermometer code as a carry.

3. A flash type analog to digital converting method, comprising:
   (a) receiving an analog signal and generating a 128-bit digital thermometer code based on the analog signal;
   (b) compressing the 128-bit thermometer code to generate a 16-bit thermometer code and a 3-bit carry; and
   (c) encoding the 16-bit thermometer code to generate a 7-bit digital signal.

4. The method of claim 3, wherein the step (b) includes:
   a $1_{st}$-compression step of generating a 64-bit thermometer code by folding the 128-bit thermometer code and XORing the corresponding bits of the 128-bit thermometer code with one another and generating a $65_{th}$-bit of the 128-bit thermometer code as a first carry;
   a $2_{nd}$-compression step of generating a 32-bit thermometer code by folding the 64-bit thermometer code and XORing the corresponding bits of the 64-bit thermometer code with one another and generating a $33_{rd}$ bit of the 64-bit thermometer code as a second carry; and
   a $3_{rd}$-compression step of generating the 16-bit thermometer code by folding the 32-bit thermometer code and XORing the corresponding bits of the 32-bit thermometer code with one another and generating a $17_{th}$ bit of the 32-bit of thermometer code as a third carry.

5. A flash type analog to digital converting circuit, comprising:
   a thermometer code generating means for receiving an analog signal and generating a $2^n$-bit digital thermometer code based on the analog signal;
   a thermometer code compression means for compressing the $2^n$-bit thermometer code to generate a compressed thermometer code, wherein the thermometer compression means compresses the $2^n$-bit thermometer code j times to generate a $(2^{n-j}+j)$-bit thermometer code, where $j \geq 1$; and
   an encoding means for encoding the compressed thermometer code to generate an n-bit digital signal.

6. The circuit of claim 5, wherein the thermometer compression means compresses the $2^n$-bit thermometer code to a $2^{n-j}$-bit digital signal by folding the $2^n$-bit thermometer code j times and XORing corresponding bits of the thermometer code with one another and generating j-number of carries by generating a $(2^{n-j-1}+1)_{th}$-bit digital signal having the $2^n$-bit thermometer code as a carry.

7. A flash type analog to digital converting circuit, comprising:
   a thermometer code generating means for receiving an analog signal and generating a 128-bit digital thermometer code based on the analog signal;
   a thermometer code compression means for compressing the 128-bit thermometer code to generate a 16-bit thermometer code and a 3-bit carry; and
   an encoding means for encoding the 16-bit thermometer code to generate a 7-bit digital signal.

8. The circuit of claim 7, wherein the thermometer code compression means includes:
   a $1_{st}$-compression means for generating a 64-bit thermometer code by folding the 128-bit thermometer code and XORing the corresponding bits of the 128-bit thermometer code with one another and generating a $65_{th}$ bit of the 128-bit thermometer code as a first carry;
   a $2_{nd}$-compression means for generating a 32-bit thermometer code by folding the 64-bit thermometer code and XORing the corresponding bits of the 64-bit thermometer code with one another and generating a $33_{rd}$ bit of the 64-bit thermometer code as a second carry; and
   a $3_{rd}$-compression means for generating the 16-bit thermometer code by folding the 32-bit thermometer code and XORing the corresponding bits of the 32-bit thermometer code with one another and generating a $17_{th}$ bit of the 32-bit thermometer code as a third carry.

9. A flash type analog to digital converting circuit, comprising:
   a thermometer code generating circuit that receives an analog signal and generates a $2^n$-bit thermometer code based on the analog signal;
   a thermometer code compression circuit that compresses the $2^n$-bit thermometer code to generate a compressed thermometer code, wherein the thermometer compression circuit compresses the $2^n$-bit thermometer code j times to generate a $(2^{n-j}+j)$-bit thermometer code, where $j \geq 1$; and
   an encoder that encodes the compressed thermometer code to generate an n-bit digital signal.

10. The circuit of claim 9, wherein the thermometer compression circuit compresses the $2^n$-bit thermometer code to a $2^{n-j}$-bit digital signal by folding the $2^n$-bit thermometer code j times and XORing corresponding bits of the $2^n$-bit thermometer code with one another and generating i-number of carries by generating a $(2^{n-j-1}+1)_{th}$-bit digital signal having the $2^n$-bit thermometer code as a carry.

* * * * *